United States Patent
Kim et al.

(10) Patent No.: US 8,432,028 B2
(45) Date of Patent: Apr. 30, 2013

(54) INTEGRATED CIRCUIT PACKAGING SYSTEM WITH PACKAGE-ON-PACKAGE AND METHOD OF MANUFACTURE THEREOF

(75) Inventors: JinGwan Kim, Seoul (KR); KyuWon Lee, Ansung-Si (KR); MoonKi Jeong, Icheon-si (KR); SunYoung Chun, Suwon-Si (KR); JiHoon Oh, Suwon (KR)

(73) Assignee: STATS ChipPAC Ltd., Singapore (SG)

( * ) Notice: Subject to any disclaimer, the term of this patent is extended or adjusted under 35 U.S.C. 154(b) by 219 days.

(21) Appl. No.: 13/053,096

(22) Filed: Mar. 21, 2011

(65) Prior Publication Data
US 2012/0241936 A1 Sep. 27, 2012

(51) Int. Cl.
H01L 23/48 (2006.01)
H01L 23/02 (2006.01)
H01L 21/44 (2006.01)

(52) U.S. Cl.
USPC .... 257/686; 257/780; 257/784; 257/E23.024; 257/E23.141; 257/E21.614; 438/107; 438/109; 438/617

(58) Field of Classification Search ........ 257/686, 257/784, 780, E23.024, E23.141, E21.614; 438/107, 109, 617
See application file for complete search history.

(56) References Cited

U.S. PATENT DOCUMENTS

| | | | |
|---|---|---|---|
| 6,686,656 B1 * | 2/2004 | Koh et al. | 257/686 |
| 6,861,288 B2 * | 3/2005 | Shim et al. | 438/109 |
| 6,870,274 B2 | 3/2005 | Huang | |
| 7,262,080 B2 * | 8/2007 | Go et al. | 438/109 |
| 7,354,800 B2 | 4/2008 | Carson | |
| 7,619,305 B2 * | 11/2009 | Fan et al. | 257/686 |
| 7,642,636 B2 * | 1/2010 | Park et al. | 257/686 |
| 7,755,180 B2 | 7/2010 | Yim et al. | |
| 7,977,780 B2 * | 7/2011 | Tay et al. | 257/686 |
| 8,035,210 B2 * | 10/2011 | Yang et al. | 257/686 |
| 8,115,112 B2 * | 2/2012 | Corisis et al. | 174/264 |
| 2004/0119153 A1 * | 6/2004 | Karnezos | 257/686 |
| 2005/0046006 A1 * | 3/2005 | Yeom | 257/686 |
| 2007/0029660 A1 * | 2/2007 | Baek | 257/686 |
| 2009/0127715 A1 | 5/2009 | Shin et al. | |
| 2009/0166835 A1 * | 7/2009 | Yang et al. | 257/686 |
| 2010/0025836 A1 * | 2/2010 | Tay et al. | 257/686 |
| 2010/0046183 A1 | 2/2010 | Park et al. | |
| 2010/0072596 A1 | 3/2010 | Pagaila et al. | |

\* cited by examiner

*Primary Examiner* — Nitin Parekh
(74) *Attorney, Agent, or Firm* — Ishimaru & Associates LLP

(57) ABSTRACT

A method of manufacture of an integrated circuit packaging system includes: providing a base substrate having a base substrate top side; mounting a base integrated circuit over the base substrate top side, the base integrated circuit having an active side opposite an inactive side with the inactive side facing the base substrate top side; attaching a peripheral interconnect to the base substrate top side and a device peripheral pad of the base integrated circuit at the active side; mounting an interposer over the base integrated circuit and the peripheral interconnect, the interposer having an interposer top side and a window; and attaching a central interconnect to the interposer top side and a device central pad of the base integrated circuit at the active side, the central interconnect through the window.

20 Claims, 4 Drawing Sheets

INTEGRATED CIRCUIT PACKAGING SYSTEM WITH PACKAGE-ON-PACKAGE AND METHOD OF MANUFACTURE THEREOF

TECHNICAL FIELD

The present invention relates generally to an integrated circuit packaging system, and more particularly to a system for an integrated circuit packaging system with package-on-package.

BACKGROUND ART

Currently, most electronic devices toward to the slim, compact, lightweight, and multi-function are inevitable tendency. Therefore, the traditional single chip packaging technology cannot satisfy with the requirement gradually. In view of the above, the development point of the package techniques is to reduce their packaging size and packaging thickness by using various stacking package techniques to package the different kinds of functional chips.

For example, one of the stacking package techniques is package on package (POP); it may stack two individual chip packages by using process procedure. The two chip packages are packaged and tested respectively and then stacked to adhere with each other, to reduce the process risk and elevate the qualified production rate. In the conventional package on package structure, two chip packages may be electrically connected by using solder.

These stacking package techniques are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate having a base substrate top side; mounting a base integrated circuit over the base substrate top side, the base integrated circuit having an active side opposite an inactive side with the inactive side facing the base substrate top side; attaching a peripheral interconnect to the base substrate top side and a device peripheral pad of the base integrated circuit at the active side; mounting an interposer over the base integrated circuit and the peripheral interconnect, the interposer having an interposer top side and a window; and attaching a central interconnect to the interposer top side and a device central pad of the base integrated circuit at the active side, the central interconnect through the window.

The present invention provides an integrated circuit packaging system, including: a base substrate having a base substrate top side; a base integrated circuit over the base substrate top side, the base integrated circuit having an active side opposite an inactive side with the inactive side facing the base substrate top side; a peripheral interconnect attached to the base substrate top side and a device peripheral pad of the base integrated circuit at the active side; an interposer over the base integrated circuit and the peripheral interconnect, the interposer having an interposer top side and a window; and a central interconnect attached to the interposer top side and a device central pad of the base integrated circuit at the active side, the central interconnect through the window.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
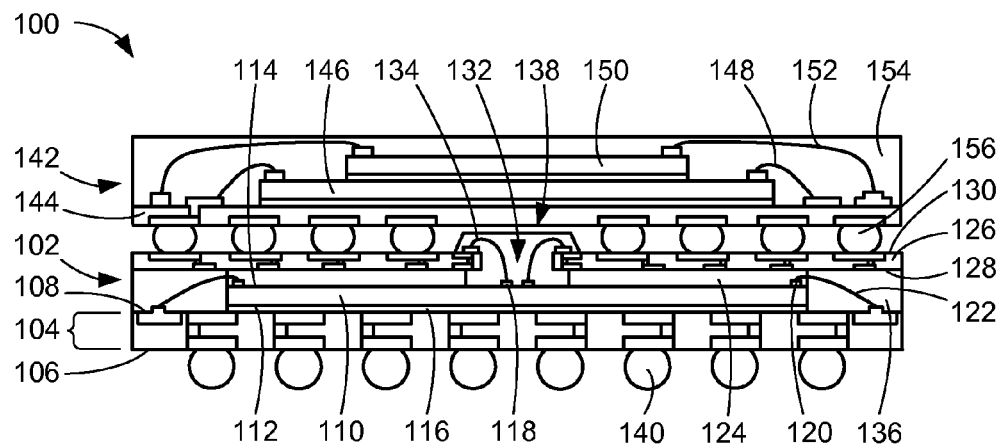
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

In accordance with high demands of three-dimensional (3D), radio frequency (RF), double data rate-2 (DDR2) device, a package considering high-speed interface with package-on-package (POP) top package has been continuously required to meet market needs. A problem with high-speed performance issue occurs by long path in 3D package, such as a POP or fan-in package-on-package (Fi-POP) package. Embodiments of the present invention provide answers or solutions to the problem.

Figure 2:
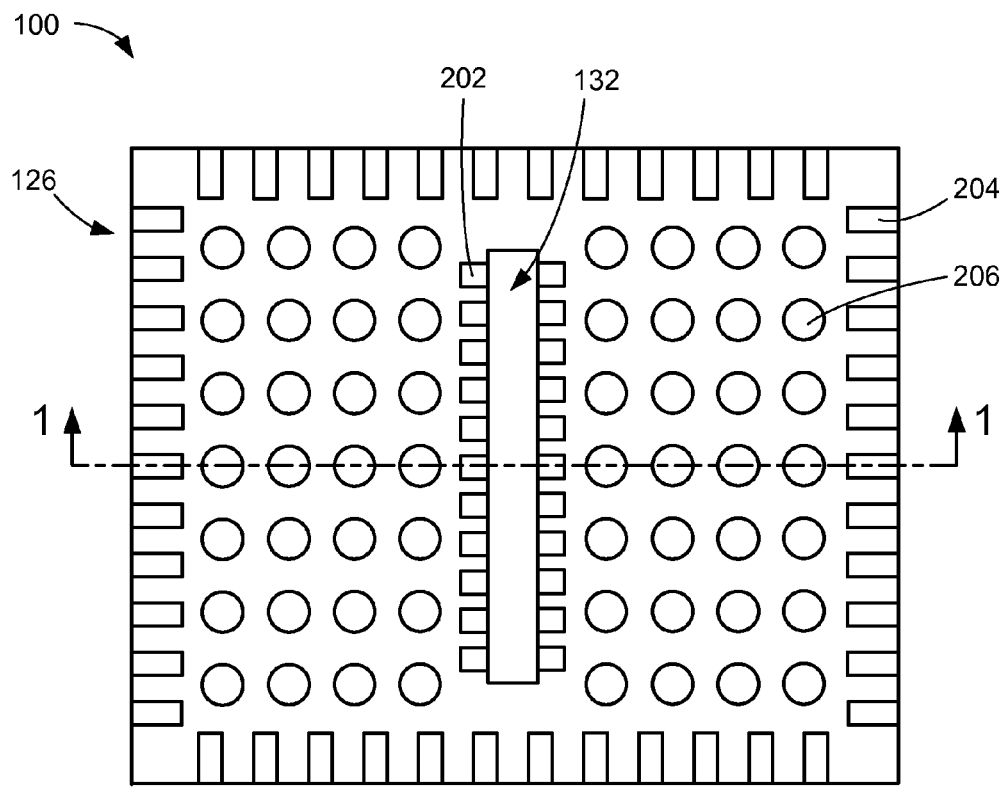
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include high-speed package-on-package (PoP) type package with device's center die pads connected through interposer.

The integrated circuit packaging system 100 can include a base package 102. The base package 102 can include a base substrate 104. The base substrate 104 can include a base substrate bottom side 106 and a base substrate top side 108 opposite the base substrate bottom side 106.

The base package 102 can include a base integrated circuit 110 having an inactive side 112 and an active side 114 opposite the inactive side 112. The base integrated circuit 110 can be mounted over the base substrate top side 108 with the inactive side 112 facing the base substrate top side 108. The base package 102 can include an attach layer 116 attached to the base substrate top side 108 and the inactive side 112.

The base integrated circuit 110 can include device central pads 118 at an interior portion of the base integrated circuit 110 at the active side 114. The device central pads 118 provide electrical connection sites for the base integrated circuit 110.

The device central pads 118 provide a role as making high-speed interface between a bottom logic die, such as the base integrated circuit 110, and a stack or top package mounted over the base package 102. Signals for interfaces, such as double data rate-2 (DDR2) and radio frequency (RF), can be assigned or routed to center pads, such as the device central pads 118.

For example, the device central pads 118 can be formed at a center of the base integrated circuit 110 at the active side 114. Also for example, the base integrated circuit 110 can include center bond pads, such as the device central pads 118.

The base integrated circuit 110 can include device peripheral pads 120 along peripheral sides of the base integrated circuit 110 at the active side 114. The device peripheral pads 120 provide electrical connection sites for the base integrated circuit 110.

The base package 102 can include peripheral interconnects 122 electrically connected or attached to the device peripheral pads 120 and the base substrate top side 108. The base package 102 can include a spacer 124 formed directly on the active side 114. The spacer 124 provides spacing for portions of the peripheral interconnects 122 that are attached to and over the active side 114. The spacer 124 can include a predetermined thickness such that top portions of the peripheral interconnects 122 can be covered and protected.

The spacer 124 can be pressed over the peripheral interconnects 122 and on a portion of the active side 114. For example, the spacer 124 can include a wire-in-film (WIF) film to provide protection and spacing for the peripheral interconnects 122. The WIF film has a low viscosity, and the viscosity gets lower when temperature increases. The WIF film can include an insulation material including a B-stage material or an adhesive. The WIF film can be hardened after curing.

The base package 102 can include an interposer 126 having an interposer bottom side 128 and an interposer top side 130 opposite the interposer bottom side 128. The interposer 126 can include a window 132 through the interposer bottom side 128 and the interposer top side 130. The window 132 can be aligned over the device central pads 118.

For example, the interposer 126 can include a board-on-chip (BOC) type interposer. Also for example, the window 132 can be provided for board-on-chip (BOC) bonding.

The interposer 126 can be mounted over the base integrated circuit 110 with the interposer bottom side 128 facing the active side 114. The interposer 126 can be mounted over the spacer 124 with the interposer bottom side 128 directly on the spacer 124.

The base package 102 can include central interconnects 134 electrically connected or attached to the device central pads 118 and a portion of the interposer top side 130 near the window 132. The central interconnects 134 can be connected through the window 132.

Since the central interconnects 134 can be connected through the window 132 and to the interposer top side 130, ball array and counts of a stack or top package can be more flexible versus existing package-on-package (POP) packages. This flexibility can be provided because signals do not have to be routed from a perimeter side of the interposer 126 to an interior portion of the interposer 126.

The central interconnects 134 can provide short connection paths for high-speed signals, such as double data rate-2 (DDR2) or radio frequency (RF) devices that require high speed interfaces. This concept can directly connect signals to the interposer 126 from a bottom logic die, such as the base integrated circuit 110, without shielding required because of a short interconnect distance.

The base package 102 can include a base encapsulation 136, which is a semiconductor package cover that seals semiconductor devices providing mechanical and environmental protection. The base encapsulation 136 can be formed over or on the base substrate top side 108 and under or on the interposer bottom side 128. The base encapsulation 136 can be formed over or on the attach layer 116, the base integrated circuit 110, the peripheral interconnects 122, the spacer 124, and the central interconnects 134.

The base encapsulation 136 can only cover the window 132, the central interconnects 134, and a portion of the interposer top side 130 next to the window 132 leaving contacts at the interposer top side 130 exposed. The base encapsulation 136 can be formed within or in the window 132. The base encapsulation 136 can include a protrusion 138 upwardly extending from the interposer top side 130. The protrusion 138 can be over a portion of the interposer top side 130. The protrusion 138 can cover top portions of the central interconnects 134.

The base package 102 can include base external interconnects 140 to electrically connect the base package 102 and an external system (not shown). The base external interconnects 140 can be attached to the base substrate bottom side 106.

The integrated circuit packaging system 100 can include a stack package 142 mounted over the base package 102. The stack package 142 can include a stack substrate 144. The stack package 142 can include a first stack integrated circuit 146 mounted over or attached to a top extent of the stack substrate 144. The stack package 142 can include first stack interconnects 148 electrically connected or attached to the first stack integrated circuit 146 and the stack substrate 144.

The stack package 142 can include a second stack integrated circuit 150 mounted over or attached to the first stack integrated circuit 146. The stack package 142 can include second stack interconnects 152 electrically connected or attached to the second stack integrated circuit 150 and the stack substrate 144.

The stack package 142 can include a stack encapsulation 154 formed over the top extent of the stack substrate 144, the first stack integrated circuit 146, the first stack interconnects 148, the second stack integrated circuit 150, and the second stack interconnects 152. The stack package 142 can include stack external interconnects 156 to electrically connect the stack package 142 and the base package 102. The stack external interconnects 156 can be connected or attached to a bottom extent of the stack substrate 144 and the interposer top side 130. The stack external interconnects 156 can surround the protrusion 138.

It has been discovered that the central interconnects 134 attached to the interposer top side 130 and the device central pads 118 provide improved performance for high-speed signals such as double data rate-2 (DDR2) and radio frequency (RF) signals.

It has been unexpectedly found that the protrusion 138 of the base encapsulation 136 covering the central interconnects 134 has a lower height than those of the stack external interconnects 156 thereby providing a low profile and reduced total size.

It has been unexpectedly determined that the interposer 126 having the window 132 and the base integrated circuit 110 having the active side 114 connected to both the central interconnects 134 and the peripheral interconnects 122 provide shorter electrical paths with reduced signal degradation resulting in improved signal integrity between the stack package 142 and the base integrated circuit 110 and between the base integrated circuit 110 and the base substrate 104.

Referring now to FIG. 2, therein is shown a top view of the integrated circuit packaging system 100. The top view depicts the integrated circuit packaging system 100 without the central interconnects 134 of FIG. 1, the protrusion 138 of FIG. 1, and the stack package 142 of FIG. 1. The top view depicts the interposer top side 130 of FIG. 1 of the interposer 126.

The interposer 126 can include interposer interior pads 202 adjacent or next to the window 132. The interposer interior pads 202 can be connected or attached to the central interconnects 134 through the window 132.

The interposer 126 can include interposer exterior pads 204 and interposer interconnect pads 206 adjacent or between the interposer exterior pads 204 and the interposer interior pads 202. The interposer exterior pads 204 can be formed along perimeter sides of the interposer 126. The interposer exterior pads 204 can surround the interposer interconnect pads 206.

The interposer interconnect pads 206 can be formed in an area array at both sides of the interposer interior pads 202 and the window 132. The interposer interconnect pads 206 can be connected or attached to the stack external interconnects 156 of FIG. 1.

For illustrative purposes, the base encapsulation 136 is not shown, although the base encapsulation 136 can be included to only cover the window 132 and a portion of the interposer top side 130 including the interposer interior pads 202. The base encapsulation 136 can leave a portion of the interposer top side 130 including the interposer exterior pads 204 and the interposer interconnect pads 206 exposed.

Figure 3:
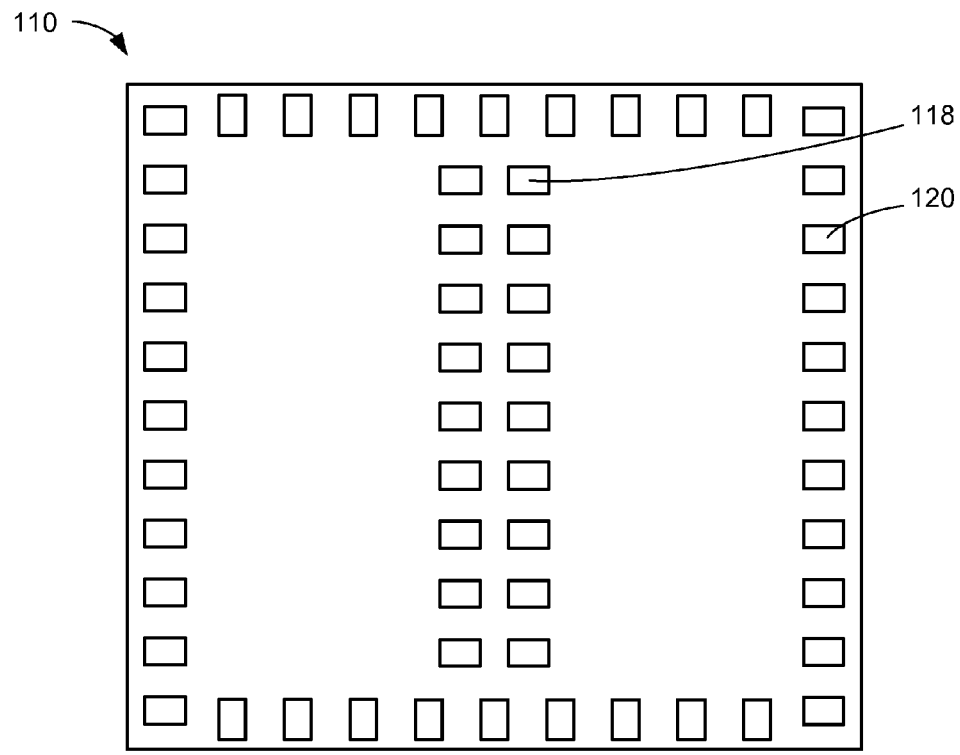
FIG. 3 is a top view of the base integrated circuit.

Referring now to FIG. 3, therein is shown a top view of the base integrated circuit 110. The top view depicts the active side 114 of FIG. 1.

The base integrated circuit 110 can include the device central pads 118 at an interior portion of the base integrated circuit 110. An array of the device central pads 118 can be formed with a number of rows at the active side 114. The device central pads 118 can be provided for high-speed connection to the interposer interior pads 202 of FIG. 2 nearest the window 132 of FIG. 1.

The base integrated circuit 110 can include the device peripheral pads 120 at a periphery of the base integrated circuit 110. A periphery array of the device peripheral pads 120 can be formed with a number of rows at the active side 114. The device peripheral pads 120 can be formed along perimeter sides of the base integrated circuit 110.

Figure 4:
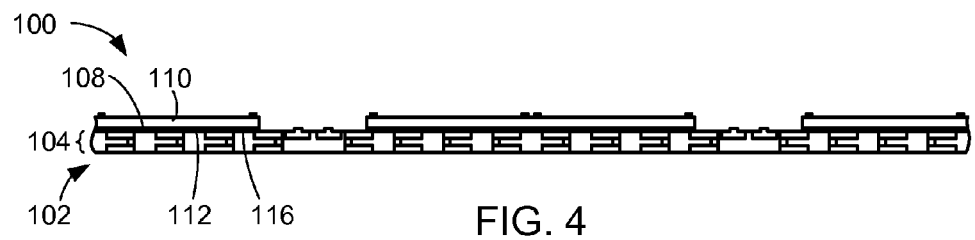
FIG. 4 is the structure of FIG. 1 in an integrated circuit attaching phase of the base package.

Referring now to FIG. 4, therein is shown the structure of FIG. 1 in an integrated circuit attaching phase of the base package 102. The integrated circuit packaging system 100 can include the base integrated circuit 110 attached to the base substrate 104. The attach layer 116 can be attached to the base substrate top side 108 of the base substrate 104 and the inactive side 112 of the base integrated circuit 110. For example, the integrated circuit attaching phase can include die attachment.

Figure 5:
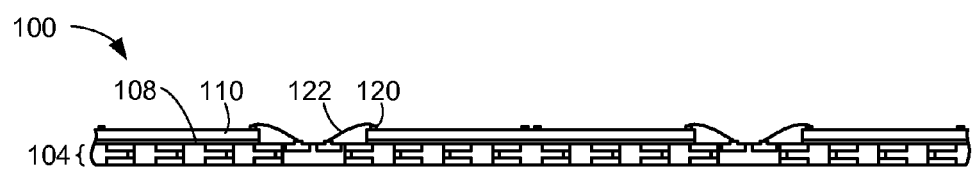
FIG. 5 is the structure of FIG. 4 in a first connector-attaching phase.

Referring now to FIG. 5, therein is shown the structure of FIG. 4 in a first connector-attaching phase. The integrated circuit packaging system 100 can include the peripheral interconnects 122 connected to the device peripheral pads 120 of the base integrated circuit 110 and the base substrate top side 108 of the base substrate 104. For example, the first connector-attaching phase can include wire-bonding.

Figure 6:
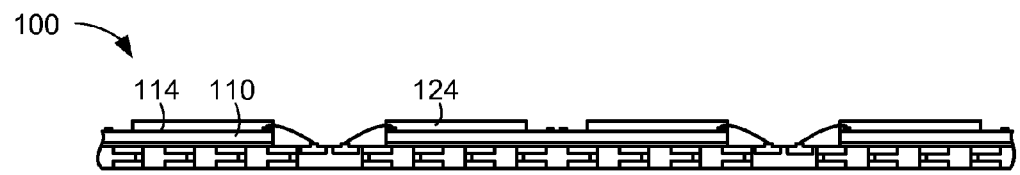
FIG. 6 is the structure of FIG. 5 in a spacer-forming phase.

Referring now to FIG. 6, therein is shown the structure of FIG. 5 in a spacer-forming phase. The integrated circuit packaging system 100 can include the spacer 124 formed directly on the active side 114 of the base integrated circuit 110. For example, the spacer 124 can include a wire-in-film (WIF) film.

Figure 7:
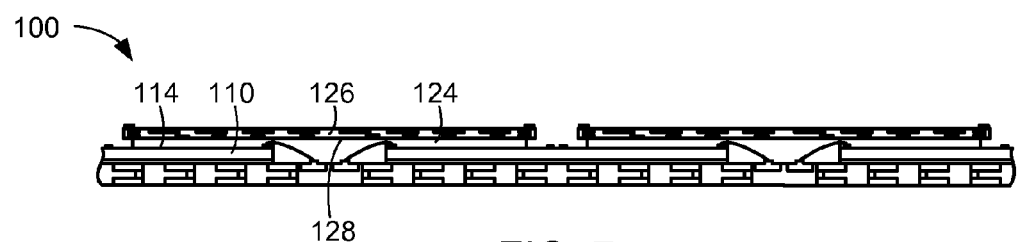
FIG. 7 is the structure of FIG. 6 in an interposer attaching phase.

Referring now to FIG. 7, therein is shown the structure of FIG. 6 in an interposer attaching phase. The integrated circuit packaging system 100 can include the interposer 126 mounted over the base integrated circuit 110 with the spacer 124 in between. The spacer 124 can be directly on the interposer bottom side 128 of the interposer 126 and the active side 114 of the base integrated circuit 110. For example, the interposer attaching phase can include board-on-chip (BOC) interposer attachment.

Figure 8:
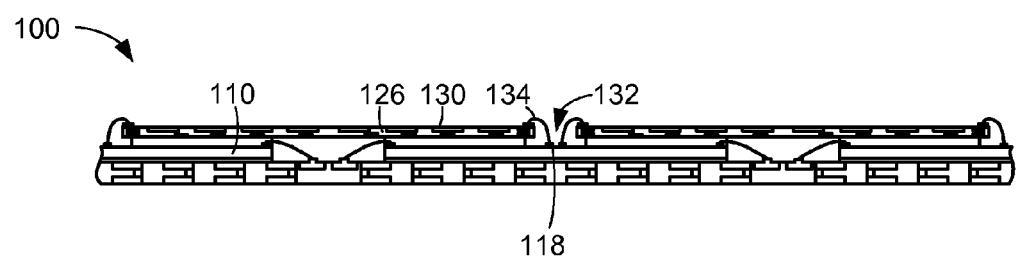
FIG. 8 is the structure of FIG. 7 in a second connector-attaching phase.

Referring now to FIG. 8, therein is shown the structure of FIG. 7 in a second connector-attaching phase. The integrated circuit packaging system 100 can include the central interconnects 134 connected to the device central pads 118 of the base integrated circuit 110 and the interposer top side 130 of the interposer 126. The central interconnects 134 can be connected through the window 132.

For example, the second connector-attaching phase can include an attachment method including gold wire bonding to form the central interconnects 134. Also for example, the second connector-attaching phase can include wire-bonding.

Figure 9:
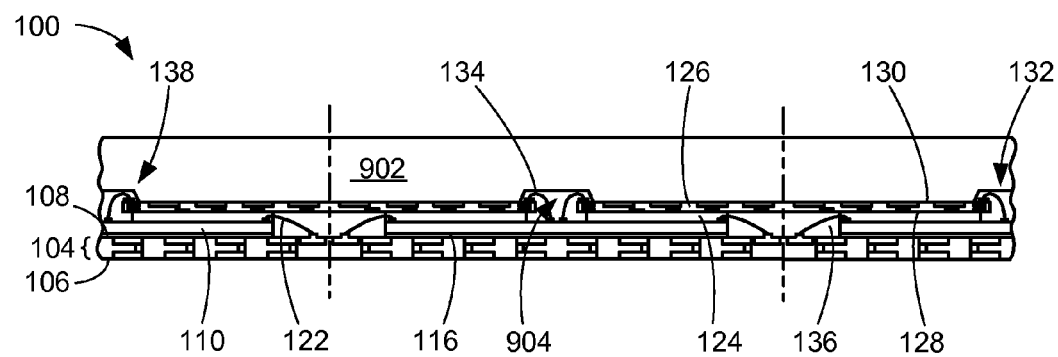
FIG. 9 is the structure of FIG. 8 in a singulation phase.

Referring now to FIG. 9, therein is shown the structure of FIG. 8 in a singulation phase. The integrated circuit packaging system 100 can include a molding method including a mold chase 902 having a chase cavity 904. The mold chase 902 can be mounted over the interposer 126 with the chase cavity 904 over the central interconnects 134 and the window 132 of the interposer 126.

The integrated circuit packaging system 100 can include the base encapsulation 136 formed with the mold chase 902. The base encapsulation 136 can be formed between or directly on the base substrate top side 108 of the base substrate 104 and the interposer bottom side 128 of the interposer 126. The base encapsulation 136 can cover the attach layer 116, the base integrated circuit 110, the peripheral interconnects 122, the spacer 124, and the central interconnects 134.

The base encapsulation 136 can be formed within the window 132. The base encapsulation 136 can include the protrusion 138 extending from the interposer top side 130. The protrusion 138 can be formed within the chase cavity 904 covering the top portions of the central interconnects 134.

The integrated circuit packaging system 100 can include a package singulation process to produce individual units of the integrated circuit packaging system 100. The package singulation process can include a mechanical or optical process. For example, the package singulation process can include a mechanical method including sawing. The integrated circuit packaging system 100 can include the base external interconnects 140 of FIG. 1 attached to the base substrate bottom side 106 of the base substrate 104 in a subsequent phase.

Figure 10:
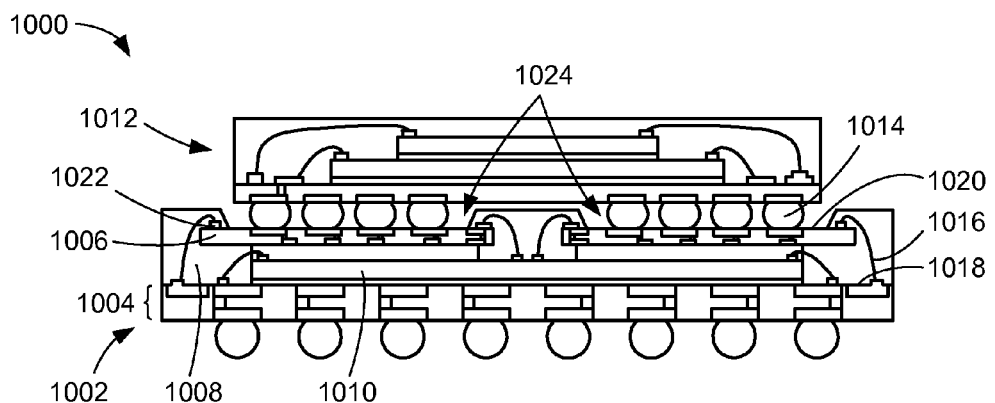
FIG. 10 is a cross-sectional view of an integrated circuit packaging system in a second embodiment of the present invention.

Referring now to FIG. 10, therein is shown a cross-sectional view of an integrated circuit packaging system 1000 in a second embodiment of the present invention. The integrated circuit packaging system 1000 can include a fan-in package-on-package (Fi-POP) type package.

In a manner similar to the integrated circuit packaging system 100 of FIG. 1, the integrated circuit packaging system 1000 can include a base package 1002 having a base substrate 1004, an interposer 1006, a base encapsulation 1008, and a base integrated circuit 1010. Also, in a manner similar to the integrated circuit packaging system 100, the integrated circuit packaging system 1000 can include a stack package 1012 having stack external interconnects 1014.

The interposer 1006 can include a length less than a length of the base substrate 1004 allowing base connectors 1016 to electrically connect a base substrate top side 1018 of the base substrate 1004 and an interposer top side 1020 of the interposer 1006. The base connectors 1016 can be connected or attached to interposer external pads 1022 of the interposer 1006 at the interposer top side 1020.

The base encapsulation 1008 can be formed over the interposer top side 1020 covering the base connectors 1016. The base encapsulation 1008 can include an encapsulation cavity 1024. A portion of the interposer top side 1020 can be exposed from the encapsulation cavity 1024. The stack external interconnects 1014 can be attached to the interposer top side 1020 within the encapsulation cavity 1024.

It has been discovered that the base connectors 1016 provide shorter connection paths between the stack package 1012 and an external system (not shown) resulting in improved signal reliability with less signal degradation.

It has been unexpectedly found that the interposer 1006 having a length less than a length of the base substrate 1004 reduces overall package footprint of the stack package 1012.

Figure 11:
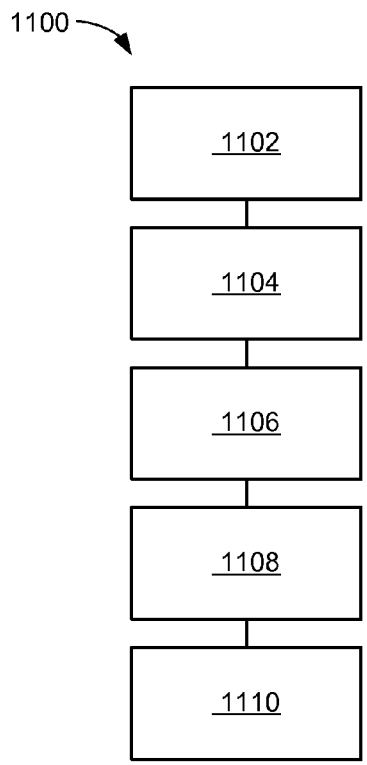
FIG. 11 is a flow chart of a method of manufacture of the integrated circuit packaging system in a further embodiment of the present invention.

Referring now to FIG. 11, therein is shown a flow chart of a method 1100 of manufacture of the integrated circuit packaging system 100 in a further embodiment of the present invention. The method 1100 includes: providing a base substrate having a base substrate top side in a block 1102; mounting a base integrated circuit over the base substrate top side, the base integrated circuit having an active side opposite an inactive side with the inactive side facing the base substrate top side in a block 1104; attaching a peripheral interconnect to the base substrate top side and a device peripheral pad of the base integrated circuit at the active side in a block 1106; mounting an interposer over the base integrated circuit and the peripheral interconnect, the interposer having an interposer top side and a window in a block 1108; and attaching a central interconnect to the interposer top side and a device central pad of the base integrated circuit at the active side, the central interconnect through the window in a block 1110.

Thus, it has been discovered that the integrated circuit packaging system of the present invention furnishes important and heretofore unknown and unavailable solutions, capabilities, and functional aspects for an integrated circuit packaging system with package-on-package. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base substrate having a base substrate top side;
   mounting a base integrated circuit over the base substrate top side, the base integrated circuit having an active side opposite an inactive side with the inactive side facing the base substrate top side;
   attaching a peripheral interconnect to the base substrate top side and a device peripheral pad of the base integrated circuit at the active side;
   mounting an interposer over the base integrated circuit and the peripheral interconnect, the interposer having an interposer top side and a window; and
   attaching a central interconnect to the interposer top side and a device central pad of the base integrated circuit at the active side, the central interconnect through the window.

2. The method as claimed in claim 1 further comprising forming a spacer directly on the active side, the spacer having a portion of the peripheral interconnect over the base integrated circuit therein.

3. The method as claimed in claim 1 further comprising forming a base encapsulation over the central interconnect and the peripheral interconnect.

4. The method as claimed in claim 1 further comprising forming a base encapsulation only covering a portion of the peripheral interconnect, the window, and an interposer interior pad of the interposer.

5. The method as claimed in claim 1 wherein mounting the interposer includes mounting the interposer over the base integrated circuit, the interposer having a length less than a length of the base substrate.

6. A method of manufacture of an integrated circuit packaging system comprising:
   providing a base substrate having a base substrate bottom side and a base substrate top side;
   mounting a base integrated circuit over the base substrate top side, the base integrated circuit having an active side opposite an inactive side with the inactive side facing the base substrate top side;
   attaching a peripheral interconnect to the base substrate top side and a device peripheral pad of the base integrated circuit at the active side;
   mounting an interposer over the base integrated circuit and the peripheral interconnect, the interposer having an interposer top side and a window;
   attaching a central interconnect to the interposer top side and a device central pad of the base integrated circuit at the active side, the central interconnect through the window; and
   attaching a base external interconnect to the base substrate bottom side.

7. The method as claimed in claim 6 further comprising:
   forming a spacer directly on the active side, the spacer having a portion of the peripheral interconnect over the base integrated circuit therein; and
   wherein:
   mounting the interposer includes mounting the interposer directly on the spacer.

8. The method as claimed in claim 6 further comprising forming a base encapsulation over the central interconnect, and partially over the peripheral interconnect and the active side.

9. The method as claimed in claim 6 further comprising forming a base encapsulation only covering a portion of the peripheral interconnect, the window, and an interposer interior pad of the interposer, the base encapsulation exposing an interposer interconnect pad of the interposer.

10. The method as claimed in claim 6 wherein:
    mounting the interposer includes mounting the interposer over the base integrated circuit, the interposer having an interposer external pad and a length less than a length of the base substrate; and
    further comprising:
    attaching a base connector to the base substrate top side and the interposer external pad.

11. An integrated circuit packaging system comprising:
    a base substrate having a base substrate top side;
    a base integrated circuit over the base substrate top side, the base integrated circuit having an active side opposite an inactive side with the inactive side facing the base substrate top side;
    a peripheral interconnect attached to the base substrate top side and a device peripheral pad of the base integrated circuit at the active side;
    an interposer over the base integrated circuit and the peripheral interconnect, the interposer having an interposer top side and a window; and
    a central interconnect attached to the interposer top side and a device central pad of the base integrated circuit at the active side, the central interconnect through the window.

12. The system as claimed in claim 11 further comprising a spacer directly on the active side, the spacer having a portion of the peripheral interconnect over the base integrated circuit therein.

13. The system as claimed in claim 11 further comprising a base encapsulation over the central interconnect and the peripheral interconnect.

14. The system as claimed in claim 11 further comprising a base encapsulation only covering a portion of the peripheral interconnect, the window, and an interposer interior pad of the interposer.

15. The system as claimed in claim 11 wherein the interposer includes the interposer over the base integrated circuit, the interposer having a length less than a length of the base substrate.

16. The system as claimed in claim 11 wherein:
    the base substrate includes a base substrate bottom side; and
    further comprising:
    a base external interconnect attached to the base substrate bottom side.

17. The system as claimed in claim 16 further comprising:
    a spacer directly on the active side, the spacer having a portion of the peripheral interconnect over the base integrated circuit therein; and
    wherein:
    the interposer includes the interposer directly on the spacer.

18. The system as claimed in claim 16 further comprising a base encapsulation over the central interconnect and over a portion of the peripheral interconnect and the active side.

19. The system as claimed in claim 16 further comprising a base encapsulation only covering a portion of the peripheral interconnect, the window, and an interposer interior pad of the interposer, the base encapsulation exposing an interposer interconnect pad of the interposer.

20. The system as claimed in claim 16 wherein:
    the interposer includes the interposer over the base integrated circuit, the interposer having an interposer external pad and a length less than a length of the base substrate; and
    further comprising:
    a base connector attached to the base substrate top side and the interposer external pad.

* * * * *